US008294729B2

(12) United States Patent
Rodgers et al.

(10) Patent No.: US 8,294,729 B2

(45) Date of Patent: Oct. 23, 2012

(54) STROKE-TO-RASTER VIDEO CONVERSION METHOD HAVING ERROR CORRECTION CAPABILITIES

(75) Inventors: Brian Rodgers, Centereach, NY (US); Michael Covitt, Ormond Beach, FL (US)

(73) Assignee: Scram Technologies, Inc., Annapolis, MD (US)

( * ) Notice: Subject to any disclaimer, the term of this patent is extended or adjusted under 35 U.S.C. 154(b) by 847 days.

(21) Appl. No.: 12/387,072

(22) Filed: Apr. 27, 2009

(65) Prior Publication Data

US 2010/0271542 A1 Oct. 28, 2010

(51) Int. Cl.

| | |
|---|---|
| ***G09G 5/02*** | (2006.01) |
| ***G09G 1/06*** | (2006.01) |
| ***G09G 1/08*** | (2006.01) |
| ***G09G 1/10*** | (2006.01) |
| ***G09G 1/14*** | (2006.01) |
| ***H04N 5/14*** | (2006.01) |
| ***H03M 1/12*** | (2006.01) |

(52) U.S. Cl. .............. 345/589; 345/12; 345/13; 345/14; 345/16; 345/20; 348/571; 348/572

(58) Field of Classification Search .............. 345/10–21, 345/558, 589; 348/571, 572
See application file for complete search history.

(56) References Cited

U.S. PATENT DOCUMENTS

| | | | | |
|---|---|---|---|---|
| 5,969,699 | A | 10/1999 | Balram et al. | |
| 6,014,765 | A | 1/2000 | Maeda et al. | |
| 6,496,160 | B1 | 12/2002 | Tanner et al. | |
| 6,671,406 | B1 | 12/2003 | Anderson | |
| 6,995,774 | B2 | 2/2006 | Tognoni et al. | |
| 7,289,159 | B1 | 10/2007 | Biagiotti et al. | |
| 2006/0125958 | A1 * | 6/2006 | Dickey et al. | 348/511 |
| 2009/0322655 | A1 * | 12/2009 | Dickey | 345/16 |

* cited by examiner

*Primary Examiner* — Xiao M. Wu
*Assistant Examiner* — Andrew Shin
(74) *Attorney, Agent, or Firm* — Matthew J. Esserman

(57) ABSTRACT

Methods of performing stroke-to-raster video conversion having leading-edge error correction and/or falling-edge error correction are provided. Incoming data is pipelined before being written into a frame buffer. This allows each sample of data to be manipulated based on information obtained in samples that occur both before and after it. Highly accurate digital conversion of stroke video into a raster format having significantly reduced or eliminated noise and stray pixels from the video is therefore achieved.

14 Claims, 5 Drawing Sheets

STROKE-TO-RASTER VIDEO CONVERSION METHOD HAVING ERROR CORRECTION CAPABILITIES

FIELD OF THE INVENTION

The present invention relates generally to the field of stroke video conversion methods, and, more specifically, to stroke-to-raster video conversion methods having error correction capabilities.

BACKGROUND OF THE INVENTION

Conventional methods for converting analog stroke display signals to raster display information for developing a raster-scan image display are considered well known. Some of these conventional conversion methods including elements and processes typically involved in common stroke-type and raster-type systems are described in U.S. Pat. No. 6,496,160, issued to Tanner et al. Such conventional conversion methods, elements, and processes are omitted from the following description for simplicity purposes but are nonetheless incorporated herein by reference.

As mentioned in the Tanner et al patent, because large numbers of stroke display systems had been installed in the past and many are still in use today (for example, stroke display systems are common in commercial and military aircraft), it has been found desirable, when upgrading an existing stroke display system, to save as much of the existing circuitry as possible, especially the stroke generator circuitry. As a result, stroke-to-raster converters have been developed to enable use of the stroke generator, but to convert the stroke generation signals to raster producing signals for use on a raster display device. In effect, a raster display replaces the stroke display to develop the desired images.

In contrast to the problem encountered and solved in the Tanner et al patent when performing a typical stroke-to-raster video conversion, significantly different problems have been frequently and consistently identified by the present inventors. Namely, as the As the X and Y deflection signals draw a symbol the Bright-Up (BU) signal is high. When the symbol is finished being drawn the BU signal drops to zero and the X and Y deflection signals "fly to" their next position to draw the next symbol. The problem exists when the fall-time of the BU signal causes a number of X and Y samples to be displayed as valid image data. These extra pixels, or "tails", are displayed as a loose string of dots rather than a line. This is because the X and Y deflection signals change at a much higher rate during the "fly to" time. The opposite can also (or instead) happen. That is, the slow rise-time of the BU signal can cause some pixels of the next symbol to be missed and therefore not be displayed at all.

It is therefore desirable to provide a method of performing stroke-to-raster video conversion having leading-edge error correction and/or falling-edge error correction, and that does not suffer from the above drawbacks.

These and other advantages of the present invention will become more fully apparent from the detailed description of the invention hereinbelow.

SUMMARY OF THE INVENTION

The present invention is directed to methods of performing stroke-to-raster video conversion having leading-edge error correction and/or falling-edge error correction. Incoming data is pipelined before being written into a frame buffer. This allows each sample of data to be manipulated based on information obtained in samples that occur both before and after it. Highly accurate digital conversion of stroke video into a raster format having significantly reduced or eliminated noise and stray pixels from the video is therefore achieved.

BRIEF DESCRIPTION OF THE DRAWINGS

For the present invention to be clearly understood and readily practiced, the present invention will be described in conjunction with the following figures, wherein.

DETAILED DESCRIPTION OF THE PREFERRED EMBODIMENTS

Figure 1:
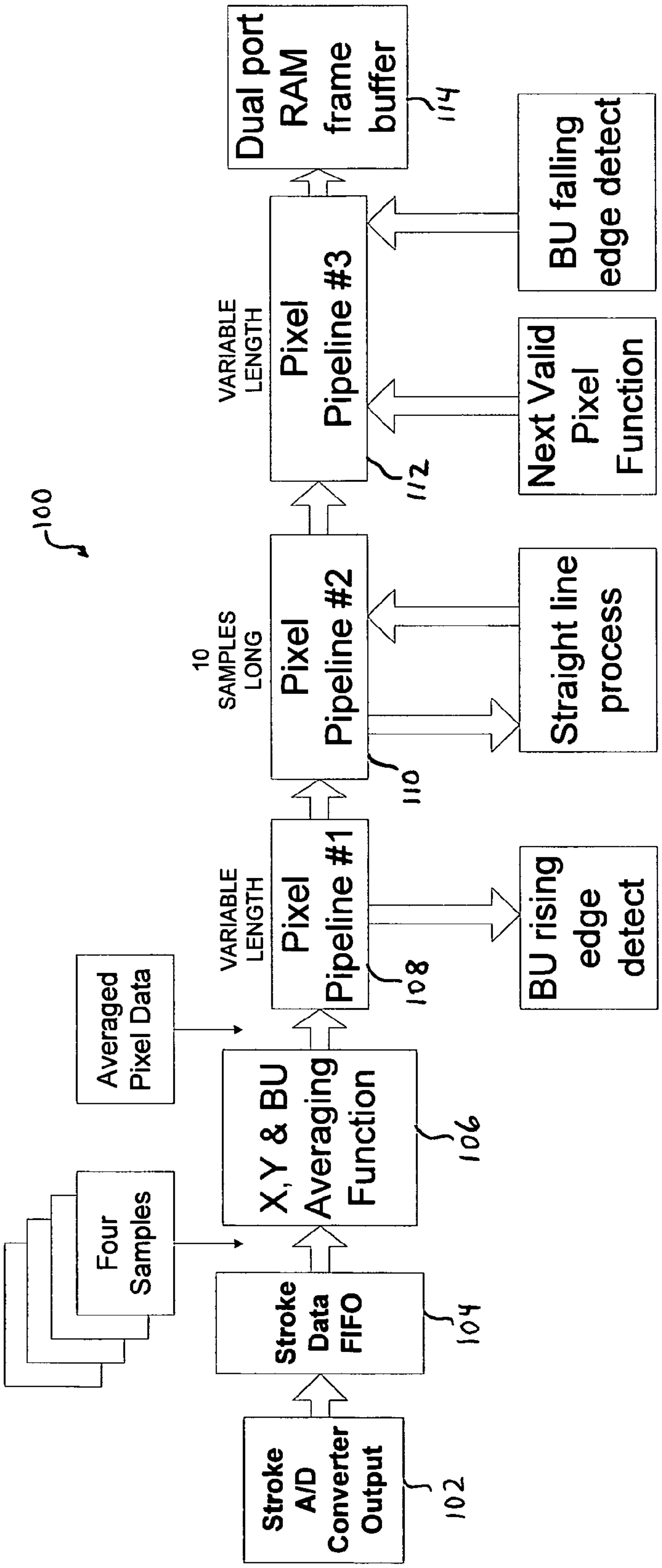
FIG. 1 is a block diagrammatical view of processes utilized in a method of performing stroke-to-raster video conversion having leading-edge error correction and falling-edge error correction, in accordance with a preferred embodiment of the present invention.

It is to be understood that the figures and descriptions of the present invention may have been simplified to illustrate elements that are relevant for a clear understanding of the present invention, while eliminating, for purposes of clarity, other elements found in a typical stroke display system, raster display system, or stroke-to-raster video conversion method (or system). Those of ordinary skill in the art will recognize that other elements may be desirable and/or required in order to implement the present invention. However, because such elements are well known in the art, and because they do not facilitate a better understanding of the present invention, a discussion of such elements is not provided herein. It is also to be understood that the drawings included herewith only provide diagrammatic representations of the presently preferred structures of the present invention and that structures falling within the scope of the present invention may include structures different than those shown in the drawings. Reference will now be made to the drawings wherein like structures are provided with like reference designations.

With respect to the figures, the circled numbers illustrate where like processes are provided with like numerals, thereby eliminating additional drawing lines for simplicity purposes.

As mentioned above, the present invention utilizes methods similar to, for example, the type disclosed in U.S. Pat. No. 6,496,160 by Tanner et al. In describing such exemplary methods below and in the accompanying figures, some details may have been omitted for purposes of clarity. However, such omitted details are to be considered conventional and thus are deemed to be within the ordinary knowledge of the skilled artisan within the relevant art.

The present invention is directed to methods of performing stroke-to-raster video conversion having leading-edge error correction and/or falling-edge error correction. As mentioned above, digital conversion of stroke video into a raster format have resulted in undesirable effects such noise and stray pixels in the rastered video. To achieve a solution to this problem, the incoming data must be pipelined before being written into the frame buffer. This allows a single sample of data to be manipulated based on information obtained in samples that occur both before and after it. Subsequently, a process that calculates a window in which the next pixel can possibly exist without violating the maximum writing speed of the deflection signals may optionally be implemented.

The first pipeline will be set up so it can be changed from 1 to 20 pixels long. Other pixel lengths of the first pipeline may be contemplated within the scope of the invention. As samples come out of the A-to-D converters and into a field-programmable gate array (FPGA) (such as a Xilinx® Virtex® 5 FPGA, for example) they will preferably be averaged in groups of four to generate a valid stroke sample. Although it is understood that other size groups of at least two may be utilized for the averaging. This sample will be registered into the first pipeline, regardless of the values it contains. When the first pipeline is full the data will be checked. When all of the BU data values in the first pipeline are equal to zero, then as the next sample is registered into the first pipeline, the first sample (which is now falling out of the first pipeline) is discarded. This process repeats until there is a sample containing a non-zero BU data value.

Once there is a non-zero BU data value in the newest sample in the first pipeline, then the BU data values of all samples in the first pipeline will be replaced with the particular non-zero BU data value of the newest sample. This process corrects the problem of the slow rise-time of BU causing missed pixel(s) at the start of writing of a symbol.

During the writing period of the symbol, the data continues to pass through the first pipeline untouched but optionally being both monitored and qualified by the "valid next pixel window" process. The data falling out of the far end of the first pipeline is registered into a second pipeline. In this second pipeline (which also may be of variable pixel length—note it may be of the same or different pixel length as that of the first pipeline) the BU data is monitored to look for the first occurrence of a zero BU data value. When a zero BU data value sample is detected at the start of the second pipeline, all the BU data values in the second pipeline are set to zero. This process corrects the problem of the slow fall-time of BU causing extra pixels or "tails" to be displayed at the end of symbols.

Two separate pipelines are used because the rise and fall times of BU may be different. The lengths of these pipelines are variable because each platform may have different rise and fall characteristics and the number of samples that are affected by this problem may be different. This adjustment may be made during the installation and bore sighting process via a DIP switch setting.

It should be noted that in the description below and in the figures, both edge-detection pipelines are being utilized in the same process. However, either the first pipeline or the second pipeline may be used alone without the use of the other pipeline. Moreover, the straightline process (for smoothing) and next valid pixel function process (both also shown in the FIG. 1 exemplary process and mentioned in the description below) may each be optionally used (i.e. either separately or together).

A method 100 of performing stroke-to-raster video conversion having leading-edge error correction is illustrated in a portion of a block diagrammatical view in FIG. 1. The method 100 comprising: providing a stroke analog-to-digital (A/D) converter (102 as shown in FIG. 1) that converts analog stroke data to digitized samples; providing a first-in, first-out (FIFO) memory 104 that receives the digitized samples from the A/D converter; reading a plurality of stroke samples from the FIFO memory; performing an averaging function 106 on the plurality of stroke samples read from the FIFO memory, wherein X-deflection values, Y-deflection values, and Bright-Up (BU) data values are each averaged thereby generating an average stroke sample; repeating the step of reading a plurality of stroke samples and the step of performing an averaging function for subsequent average stroke samples which correspond to respectively subsequent analog stroke data, thereby generating a plurality of average stroke samples; providing a first pipeline 108 with a first end and a second end, wherein each average stroke sample within the plurality of average stroke samples is sequentially registered into the first end of the first pipeline as corresponding pixel values, respectively; performing a function that checks the BU data values of the plurality of average stroke samples within the first pipeline when the first pipeline is full of the plurality of average stroke samples, wherein the step of performing a function comprises: wherein when all the BU data values are equal to zero, then as a newest average stroke sample is registered at the first end of the first pipeline, an oldest average stroke sample is discarded at the second end of the first pipeline; and wherein once there is a non-zero BU data value detected from a newest average stroke sample at the first end of the first pipeline, then each BU data value of the remaining average stroke samples within the first pipeline is replaced with the non-zero BU data value, and an oldest average stroke sample at the second end of the first pipeline exits the first pipeline for further processing using the non-zero BU data value, and wherein the non-zero BU data value provides a leading-edge error correction due to a slow rise-time of BU data values. The BU data values are preferably BU intensity data values. The plurality of stroke samples read from the FIFO memory is four, whereby the step of performing an averaging function 106 is performed on the four stroke samples. The step of providing a FIFO memory, the step of reading a plurality of stroke samples, the step of performing an averaging function, the step of repeating, the step of providing a first pipeline, and the step of performing a function are all contained within a field-programmable gate array (FPGA). The further processing comprises writing the oldest average stroke sample that exited the first pipeline into a RAM frame buffer (such as a dual port RAM frame buffer 114, for example). The further processing comprises registering the oldest average stroke sample that exited the first pipeline into a second pipeline 112. The further processing comprises registering the oldest average stroke sample that exited the first pipeline 108 into a second pipeline 112, and wherein the method further comprises providing at least one intermediary process between the first pipeline and the second pipeline, wherein the at least one intermediary process processes the oldest average stroke sample that exited the first pipeline. The at least one intermediary process may be the straight line process and/or the Next Valid Pixel Function process as described below, for example.

Another method of performing stroke-to-raster video conversion having falling-edge error correction is also shown by a portion of FIG. 1. In this method, the pipeline which is the focus of this method is pipeline 112 (FIG. 1). The method comprising: providing a stroke analog-to-digital (A/D) converter that converts analog stroke data to digitized samples; providing a first-in, first-out (FIFO) memory that receives the digitized samples from the A/D converter; reading a plurality of stroke samples from the FIFO memory; performing an averaging function on the plurality of stroke samples read from the FIFO memory, wherein X-deflection values, Y-deflection values, and Bright-Up (BU) data values are each averaged thereby generating an average stroke sample; repeating the step of reading a plurality of stroke samples and the step of performing an averaging function for subsequent average stroke samples which correspond to respectively subsequent analog stroke data, thereby generating a plurality of average stroke samples; providing a pipeline 112 with a first end and a second end, wherein each average stroke sample within the plurality of average stroke samples is sequentially registered into the first end of the pipeline 112 as corresponding pixel values, respectively; performing a function that checks the BU data values of the plurality of average stroke samples within the pipeline 112 when the pipeline 112 is full of the plurality of average stroke samples, wherein the step of performing a function comprises: wherein when all the BU data values are equal to a non-zero, then as a newest average stroke sample is registered at the first end of the pipeline 112, an oldest average stroke sample at the second end of the pipeline 112 exits the pipeline for further processing using its non-zero BU data value; and wherein once there is a zero BU data value detected from a newest average stroke sample at the first end of the pipeline 112, then each BU data value of the remaining average stroke samples within the pipeline 112 is replaced with a zero BU data value, and an oldest average stroke sample is discarded at the second end of the pipeline 112, and wherein any replacement using a zero BU data value provides a falling-edge error correction due to a slow fall-time of BU data values. The BU data values are preferably BU intensity data values. The plurality of stroke samples read from the FIFO memory is four, whereby the step of performing an averaging function 106 is performed on the four stroke samples. The step of providing a FIFO memory, the step of reading a plurality of stroke samples, the step of performing an averaging function, the step of repeating, the step of providing a pipeline, and the step of performing a function are all contained within a field-programmable gate array (FPGA). The further processing comprises writing the oldest average stroke sample that exited the pipeline into a RAM frame buffer (such as a dual port RAM frame buffer 114, for example). The further processing comprises registering the oldest average stroke sample that exited the pipeline 112 into another pipeline (108 for example). The method may further comprise providing at least one intermediary process between the step of repeating and the step of providing a pipeline, wherein the at least one intermediary process processes each average stroke sample within the plurality of average stroke samples. The at least one intermediary process may be the straight line process and/or the Next Valid Pixel Function process as described below, for example.

Figure 2:
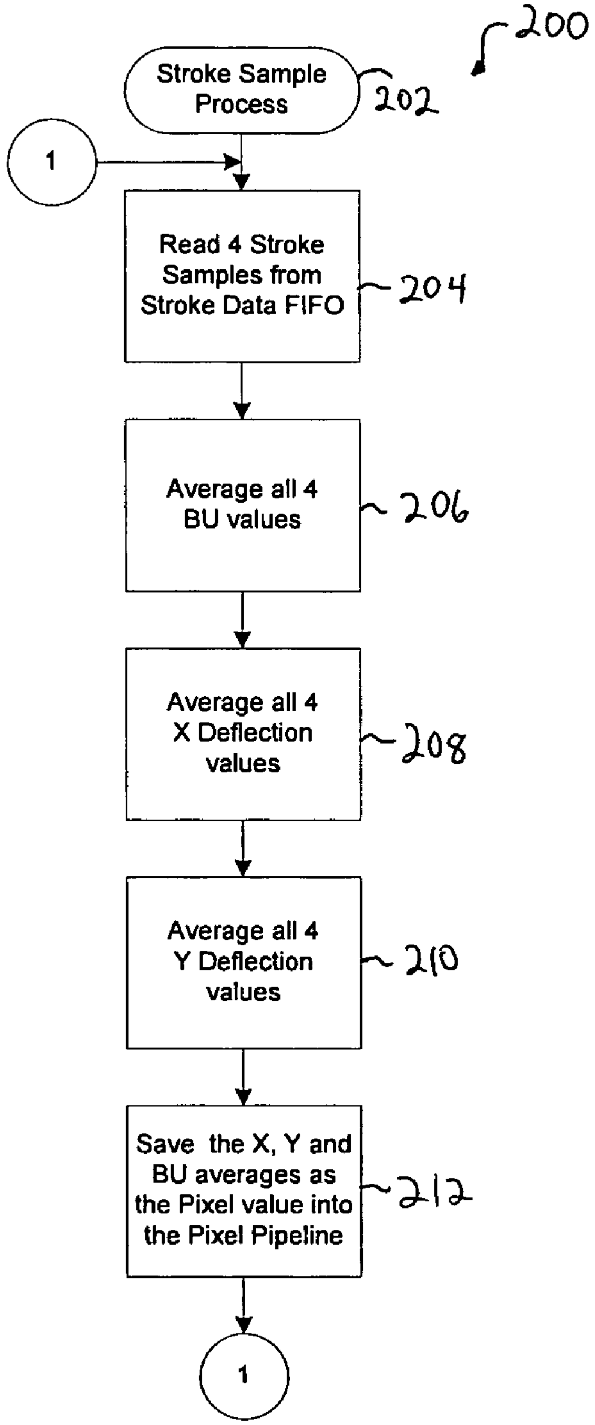
FIG. 2 is a flow chart illustrating operational characteristics for performing an averaging function process utilized as a process shown in FIG. 1, in accordance with a preferred embodiment of the present invention.

FIG. 2 is a flow chart illustrating operational characteristics for performing an averaging function process utilized as a process shown in FIG. 1. Namely, the stroke sample process 200 begins at step 202. At step 204, 4 stroke samples are read from the Stroke Data FIFO. At step 206, all 4 BU data values are averaged. At step 208, all 4 X deflection values are averaged. At step 210, all 4 Y deflection values are averaged. In step 212, the X, Y, and BU averages are saved as the pixel value into the pipeline.

Figure 3:
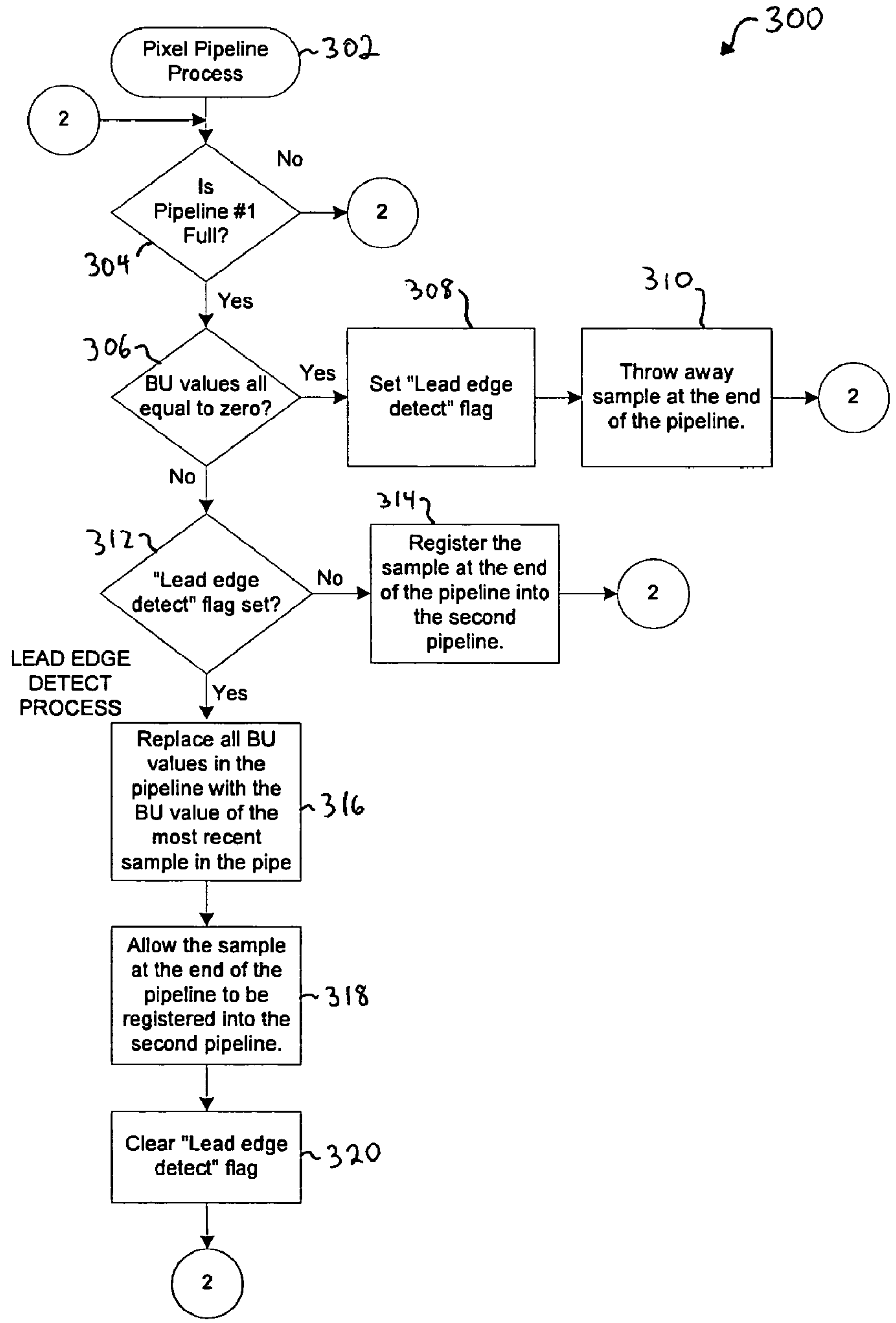
FIG. 3 is a flow chart illustrating operational characteristics for performing a leading-edge detection process utilized as a process shown in FIG. 1, in accordance with a preferred embodiment of the present invention.

FIG. 3 is a flow chart illustrating operational characteristics for performing a leading-edge detection process utilized as a process shown in FIG. 1. Namely, the pixel pipeline process 300 begins at step 302. Step 304 comprises determining whether pipeline #1 is full. Step 306 comprises determining whether the BU values are all equal to zero. Step 308 sets the "lead edge detect" flag. Step 310 throws away the sample at the end of the pipeline. Step 312 determines whether the "lead edge detect" flag is set. Step 314 registers the sample at the end of the pipeline into the second pipeline. Step 316 replaces all BU values in the pipeline with the BU value of the most recent sample in the pipeline. Step 318 allows the sample at the end of the pipeline to be registered into the second pipeline. In step 320, the "lead edge detect" flag is cleared.

Figure 4:
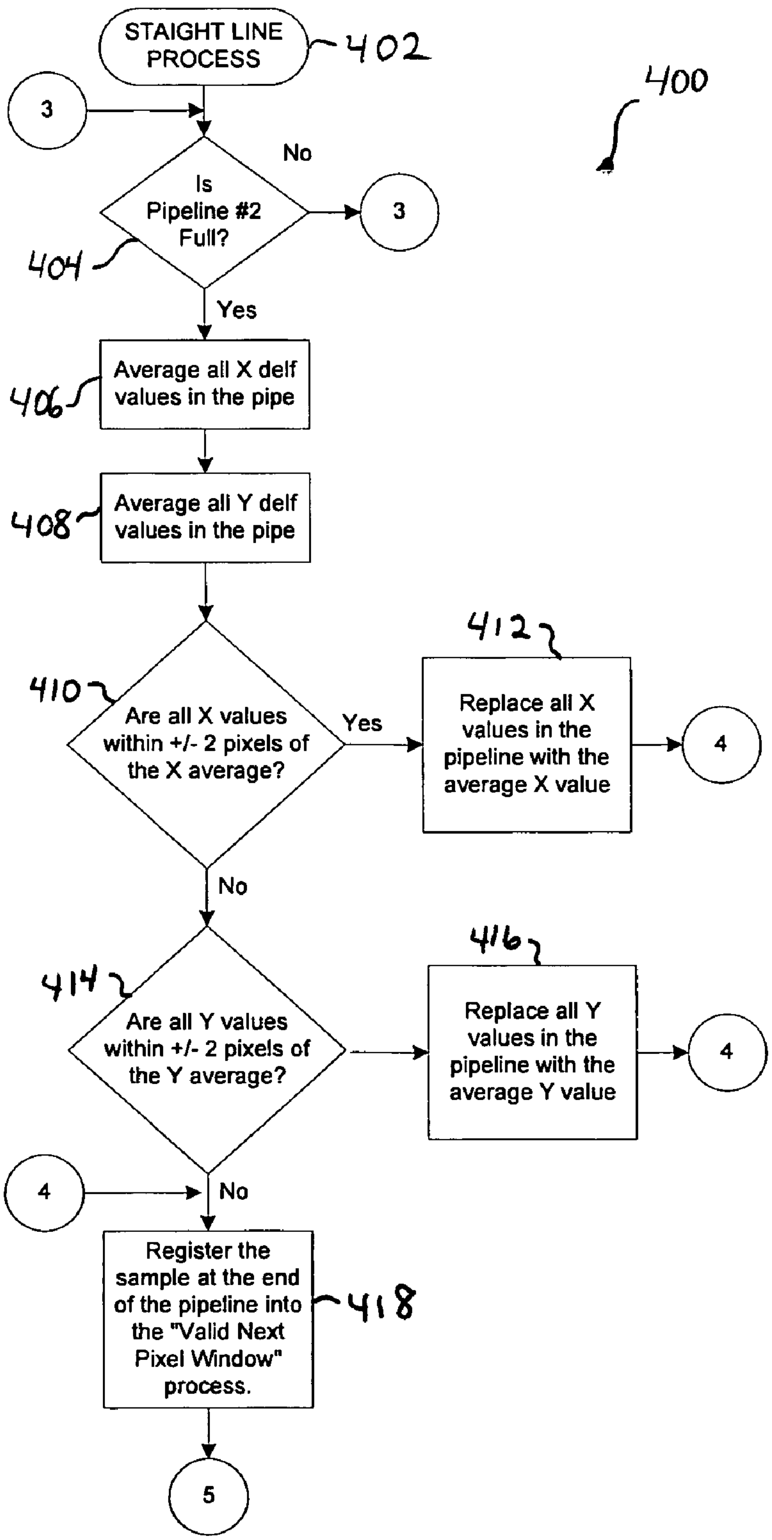
FIG. 4 is a flow chart illustrating operational characteristics for performing a straight-line process utilized as a process shown in FIG. 1, in accordance with a preferred embodiment of the present invention.

FIG. 4 is a flow chart illustrating operational characteristics for performing a straight-line process utilized as a process shown in FIG. 1. Namely, the straight line process 400 begins at step 402. Step 404 comprises determining whether pipeline #2 is full. Step 406 averages all X deflection values in the pipeline. Step 408 averages all Y deflection values in the pipeline. Step 410 determines whether all X values are within ±2 pixels of the X average. If so, step 412 replaces all X values in the pipeline with the average X value. Step 414 determines whether all Y values are within ±2 pixels of the Y average. If so, step 416 replaces all Y values in the pipeline with the average Y value. Step 418 registers the sample at the end of the pipeline into the "Valid Next Pixel Window" process.

Figure 5:
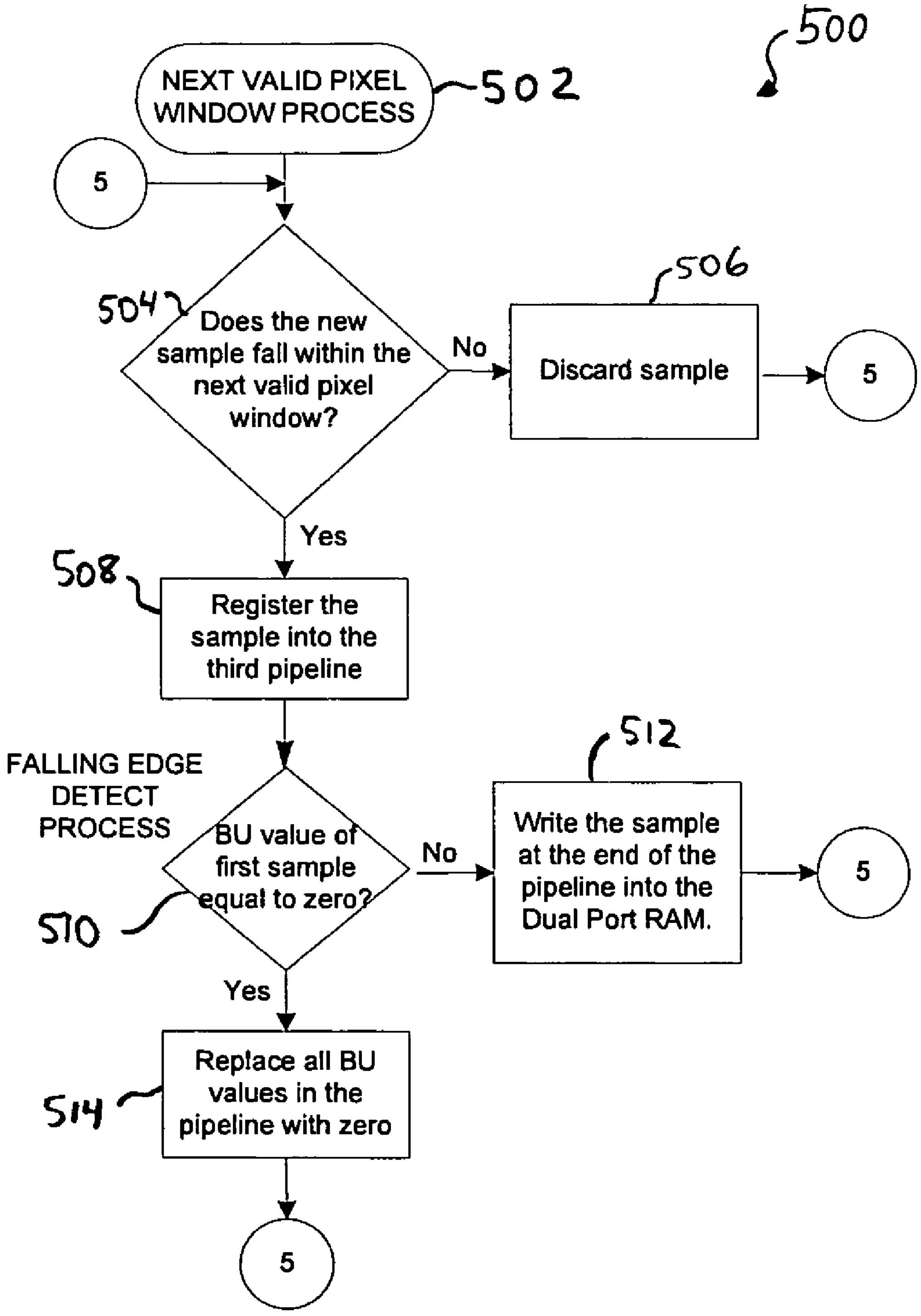
FIG. 5 is a flow chart illustrating operational characteristics for performing a next valid pixel window process and falling-edge detection process utilized as processes shown in FIG. 1, in accordance with a preferred embodiment of the present invention.

FIG. 5 is a flow chart illustrating operational characteristics for performing a next valid pixel window process and falling-edge detection process utilized as processes shown in FIG. 1. Namely, the Next Valid Pixel Window process 500 begins at step 502. Step 504 determines whether the new sample falls within the next valid pixel window. If not, the sample is discarded (step 506). Step 508 registers the sample into the third pipeline. Step 510 determines whether the BU value of the first sample is equal to zero. Step 512 writes the sample at the end of the pipeline into the dual port RAM. Step 514 replaces all BU values in the pipeline with zero.

It is noted that any responses to operational interrogatories (e.g. "yes" or "no") in the above descriptions of the steps within the flow charts may have been omitted for simplicity purposes but are illustrated in detail in the figures.

The specific processes mentioned above from the Stoke Data FIFO memory to and including Pipeline #3 (see FIG. 1) may be incorporated as hardware/software/VHDL programming language/code and is preferably contained within a field-programmable gate array (FPGA). As commonly known, VHDL stands for VHSIC (Very High Speed Integrated Circuits) Hardware Description Language. A Xilinx®-type FPGA is preferable but other types (even from other manufactures) may also be contemplated within the scope of the present invention.

In an exemplary embodiment of the present invention, the X and Y deflection signals come in as ±10V differential signals. They are received by the video board and converted to single-ended. The ±10V single-ended signal will then be filtered with a low-pass filter to eliminate all high frequency noise. This filtered signal will then be sent to two separate circuits. The first circuit will crop off the negative side of the signal. The second circuit will cut off the positive side of the signal and then invert it. The result is two signals that range from −0.7V to +10V. These signals will then be divided by 5 to change the range down to −0.14V to +2V so they fall within the valid input range of the A-to-D converters.

By the end of the analog signal chain the two signals (X deflection and Y deflection) will have become four signals. These four signals will be connected to four A-to-D converters (we can call them X1, X2, Y1 and Y2). When the X deflection input is representing a pixel position on the right half of the screen, the X1 A-to-D converter will have valid data on the output and the X2 A-to-D converter will have the "out-of-range" signal asserted. This happens because the rectifier circuit crops the signal in a way that allows the signal to go slightly negative. Any negative voltage on the input of the A-to-D will cause the out-of-range signal to go active. When the X deflection input is representing a pixel position on the left half of the screen, the opposite will be true (i.e. X2 A-to-D has data, X1 asserts out of range).

The Y defection signal is set up the same way. The top half of the screen is assigned to Y1 and the bottom half of the screen is assigned to Y2. The A-to-D converters will preferably be sampling the signals at 48.5 MHz. This will give 4 samples for every pixel we need to display. The same 48.5 Mhz clock that is used for the A-to-D sample clock may be used to write the A-to-D output data into a FIFO inside the FPGA (of, for example, Xilinx®-type).

The FPGA process will wait until there is preferably 400 samples in the FIFO. This data will be read out in bursts at a much higher rate so it can be processed and written into RAM while keeping up with incoming data.

Each word of data read out of the FIFO will be 64 bits wide. These 64 bits will contain all information relevant to the stroke signal inputs for one 48.5 Mhz sample time. The data format of the FIFO output data may be as follows:

Bits 11:0—Positive X deflection data
Bits 3:12—Negative X deflection data
Bits 35:24—Positive Y deflection data
Bits 47:36—Negative Y deflection data
Bit 48—Positive X deflection out of range
Bit 49—Negative X deflection out of range
Bit 50—Positive Y deflection out of range
Bit 51—Negative Y deflection out of range
Bits 63:52—BU data Four data words will be read out of the FIFO and the deflection data values and BU data values will be averaged. In the first pipeline 108 (FIG. 1), the BU data value will then be looked at to determine if BU is greater than zero. If the BU data value is equal to zero then that word will be thrown away and the process will repeat on the next four samples.

Once a BU value is identified as valid (i.e. greater than zero), that word of data will be registered into a preferably 10-word long pipeline 110. At the point when there is valid data in the last register in the pipeline, all ten values will be averaged. Then the difference between each data value and the average will be calculated. If all the differences are preferably less than 3 pixels, all data values will be replaced with the average. This particular smoothing aspect is the optional straight line process.

Then the pipeline 110 will advance. A new word registered into the front end and the data falling off the far end will be compared to the current value of the "Next Valid Pixel Location window". If the pixel location is valid, it will be registered into another pipeline 112 and the next valid pixel location window will be updated. This particular validation aspect is the optional Next Valid Pixel Function process.

The another pipeline 112 will be used to stop writing data into RAM if the BU signal proves to have a slow fall-time. It may not be detected for several pixels, so if that data is still being piped towards the RAM it can be cleared before it gets written in.

Those of ordinary skill in the art will recognize that various modifications and variations may be made to the embodiments described above without departing from the spirit and scope of the present invention. For example, although the pixel pipelines 108, 112 are described in the exemplary embodiment as being in a particular order, they may be reversed. The present invention may alternatively utilize only one of the pixel pipelines 108, 112. The averaging function 106, straight line process and next valid pixel function process may each be optionally employed without departing from the spirit of the present invention. It is therefore to be understood that the present invention is not limited to the particular embodiments disclosed above, but it is intended to cover such modifications and variations as defined by the following claims.

What is claimed is:

1. A method of performing stroke-to-raster video conversion having leading-edge error correction, the method comprising:

providing a stroke analog-to-digital (A/D) converter that converts analog stroke data to digitized samples;

providing a first-in, first-out (FIFO) memory that receives the digitized samples from the A/D converter;

reading a plurality of stroke samples from the FIFO memory;

performing an averaging function on the plurality of stroke samples read from the FIFO memory, wherein X-deflection values, Y-deflection values, and Bright-Up (BU) data values are each averaged thereby generating an average stroke sample;

repeating the step of reading a plurality of stroke samples and the step of performing an averaging function for subsequent average stroke samples which correspond to respectively subsequent analog stroke data, thereby generating a plurality of average stroke samples;

providing a first pipeline with a first end and a second end, wherein each average stroke sample within the plurality of average stroke samples is sequentially registered into the first end of the first pipeline as corresponding pixel values, respectively;

performing a function that checks the BU data values of the plurality of average stroke samples within the first pipeline when the first pipeline is full of the plurality of average stroke samples, wherein the step of performing a function comprises:

wherein when all the BU data values are equal to zero, then as a newest average stroke sample is registered at the first end of the first pipeline, an oldest average stroke sample is discarded at the second end of the first pipeline; and wherein once there is a non-zero BU data value detected from a newest average stroke sample at the first end of the first pipeline, then each BU data value of the remaining average stroke samples within the first pipeline is replaced with the non-zero BU data value, and an oldest average stroke sample at the second end of the first pipeline exits the first pipeline for further processing using the non-zero BU data value, and wherein the non-zero BU data value provides a leading-edge error correction due to a slow rise-time of BU data values.

2. The method of claim 1, wherein the BU data values are BU intensity data values.

3. The method of claim 1, wherein the plurality of stroke samples read from the FIFO memory is four, whereby the step of performing an averaging function is performed on the four stroke samples.

4. The method of claim 1, wherein the step of providing a FIFO memory, the step of reading a plurality of stroke samples, the step of performing an averaging function, the step of repeating, the step of providing a first pipeline, and the step of performing a function are all contained within a field-programmable gate array (FPGA).

5. The method of claim 1, wherein the further processing comprises writing the oldest average stroke sample that exited the first pipeline into a RAM frame buffer.

6. The method of claim 1, wherein the further processing comprises registering the oldest average stroke sample that exited the first pipeline into a second pipeline.

7. The method of claim 1, wherein the further processing comprises registering the oldest average stroke sample that exited the first pipeline into a second pipeline, and wherein the method further comprises providing at least one intermediary process between the first pipeline and the second pipeline, wherein the at least one intermediary process processes the oldest average stroke sample that exited the first pipeline.

8. A method of performing stroke-to-raster video conversion having falling-edge error correction, the method comprising:

providing a stroke analog-to-digital (A/D) converter that converts analog stroke data to digitized samples;

providing a first-in, first-out (FIFO) memory that receives the digitized samples from the A/D converter;

reading a plurality of stroke samples from the FIFO memory;

performing an averaging function on the plurality of stroke samples read from the FIFO memory, wherein X-deflection values, Y-deflection values, and Bright-Up (BU) data values are each averaged thereby generating an average stroke sample;

repeating the step of reading a plurality of stroke samples and the step of performing an averaging function for subsequent average stroke samples which correspond to respectively subsequent analog stroke data, thereby generating a plurality of average stroke samples;

providing a pipeline with a first end and a second end, wherein each average stroke sample within the plurality of average stroke samples is sequentially registered into the first end of the pipeline as corresponding pixel values, respectively;

performing a function that checks the BU data values of the plurality of average stroke samples within the pipeline when the pipeline is full of the plurality of average stroke samples, wherein the step of performing a function comprises:

wherein when all the BU data values are equal to a non-zero, then as a newest average stroke sample is registered at the first end of the pipeline, an oldest average stroke sample at the second end of the pipeline exits the pipeline for further processing using its non-zero BU data value; and wherein once there is a zero BU data value detected from a newest average stroke sample at the first end of the pipeline, then each BU data value of the remaining average stroke samples within the pipeline is replaced with a zero BU data value, and an oldest average stroke sample is discarded at the second end of the pipeline, and wherein any replacement using a zero BU data value provides a falling-edge error correction due to a slow fall-time of BU data values.

9. The method of claim 8, wherein the BU data values are BU intensity data values.

10. The method of claim 8, wherein the plurality of stroke samples read from the FIFO memory is four, whereby the step of performing an averaging function is performed on the four stroke samples.

11. The method of claim 8, wherein the step of providing a FIFO memory, the step of reading a plurality of stroke samples, the step of performing an averaging function, the step of repeating, the step of providing a pipeline, and the step of performing a function are all contained within a field-programmable gate array (FPGA).

12. The method of claim 8, wherein the further processing comprises writing the oldest average stroke sample that exited the pipeline into a RAM frame buffer.

13. The method of claim 8, wherein the further processing comprises registering the oldest average stroke sample that exited the pipeline into another pipeline.

14. The method of claim 8 further comprising providing at least one intermediary process between the step of repeating and the step of providing a pipeline, wherein the at least one intermediary process processes each average stroke sample within the plurality of average stroke samples.

* * * * *